US00RE41509E

(19) United States
(12) Reissued Patent
Kinzer et al.

(10) Patent Number: US RE41,509 E
(45) Date of Reissued Patent: Aug. 17, 2010

(54) HIGH VOLTAGE VERTICAL CONDUCTION SUPERJUNCTION SEMICONDUCTOR DEVICE

(75) Inventors: Daniel M. Kinzer, El Segundo, CA (US); Srikant Sridevan, Redondo Beach, CA (US)

(73) Assignee: International Rectifier Corporation, El Segundo, CA (US)

(21) Appl. No.: 11/207,203

(22) Filed: Aug. 18, 2005

Related U.S. Patent Documents

Reissue of:
(64) Patent No.: 6,608,350
Issued: Aug. 19, 2003
Appl. No.: 09/732,401
Filed: Dec. 7, 2000

(51) Int. Cl.
*H01L 29/78* (2006.01)

(52) U.S. Cl. ..... 257/341; 257/331; 257/339; 257/E29.201

(58) Field of Classification Search ..... 257/341, 257/339, 331
See application file for complete search history.

(56) References Cited

U.S. PATENT DOCUMENTS 4,754,310 A 6/1988 Coe
4,855,804 A * 8/1989 Bergami et al. ..... 257/622
6,103,578 A * 8/2000 Uenishi et al. ..... 438/268
6,184,555 B1 * 2/2001 Tihanyi et al. ..... 257/342
6,452,230 B1 9/2002 Boden, Jr.
6,593,619 B1 * 7/2003 Blanchard ..... 257/328

OTHER PUBLICATIONS

A Scalable Trench Etch Based Process for High Voltage Vertical Resurf Mosfets, C. Rochefort and R. van Dalen, Proceedings of the 17th International Symposium on Power Semiconductor Devices & IC's, May 23–26, 2005, Santa Barbara, CA.
International Search Report dated Apr. 5, 2002 from the International Searching for corresponding PCT Appln. No. PCT/US01/47275.*

* cited by examiner

*Primary Examiner*—Jerome Jackson, Jr.
(74) *Attorney, Agent, or Firm*—Farjami & Farjami LLP

(57) ABSTRACT

A high voltage vertical conduction semiconductor device has a plurality of deep trenches or holes in a lightly doped body of one conductivity type. A diffusion of the other conductivity type is formed in the trench walls to a depth and a concentration which matches that of the body so that, under reverse blocking, both regions fully deplete. The elongated trench or hole is filled with a dielectric which may be a composite of nitride and oxide layers having a lateral dimension change matched to that of the silicon. The filler may also be a highly resistive SIPOS which permits leakage current flow from source to drain to ensure a uniform electric field distribution along the length of the trench during blocking.

27 Claims, 3 Drawing Sheets

HIGH VOLTAGE VERTICAL CONDUCTION SUPERJUNCTION SEMICONDUCTOR DEVICE

Matter enclosed in heavy brackets [ ] appears in the original patent but forms no part of this reissue specification; matter printed in italics indicates the additions made by reissue.

FIELD OF THE INVENTION

This invention relates to semiconductor devices and more specifically relates to novel vertical conduction superjunction type devices and their methods of manufacture.

BACKGROUND OF THE INVENTION

Superjunction semiconductor devices are well known and generally provide plural layers of P and N regions connected between a source and drain region. In order to turn the device on in a forward conduction direction, current flow can proceed, for example, through the N type regions, which have a relatively high N type concentration. Thus, the device has a relatively low on resistance per unit area, or $R_{DSON}$. To turn the device off, the adjacent P and N regions are caused to fully deplete, thus blocking current flow and turning the device off.

Superjunction devices of these types are shown in U.S. Pat. Nos. 5,216,275 and 4,754,310, and are also shown in copending application Ser. No. 60/113,641, filed Dec. 23, 1998 (IR-1676 Prov) in the name of Boden, and assigned to the assignee of the present invention.

BRIEF DESCRIPTION OF THE PRESENT INVENTION

The present invention provides a novel superjunction structure capable of blocking very high voltages, while having an ultra low on-resistance in the conduction mode.

In accordance with a first feature of the invention a plurality of deep P-type regions are shorted to the ground terminal placed within the N-type drift regions to assist in the depletion of these N-type regions during the blocking mode and to allow the use of even higher doping in the N-type regions. This further reduces the on-resistance contribution of the drift region, which is the principal source of on-resistance in devices in a high voltage range. The deep P-type regions are formed by etching deep trenches and doping the trench sidewalls with the appropriate P-type dose. The use of trench gates further allows increased density and reduced on-resistance.

In accordance with a second feature of the invention, the deep trenches are lined with an oxide film and then filled with a SIPOS (semi-insulating polysilicon) layer which is shorted to the drain through an opening in the oxide liner. The SIPOS is also shorted to the source at the top of the structure. This provides a highly resistive leakage path between source and drain causing the potential distribution to be uniform, thus reinforcing the RESURF effect of the trench sidewall doping.

In accordance with a third feature of the invention, the oxide used to fill the trench is replaced by alternate layers of oxide ($SiO_2$) and nitride ($Si_3N_4$). The thermal coefficient of expansion of the nitride layer is greater than that of the oxide and of the parent silicon so that when the dielectric deposit cools, it shrinks as much as the silicon, reducing the material stress that would otherwise be present, had the dielectric had a different expansion coefficient from that of the silicon.

BRIEF DESCRIPTION OF THE DRAWING(S)

DETAILED DESCRIPTION OF THE DRAWINGS

Figure 1:
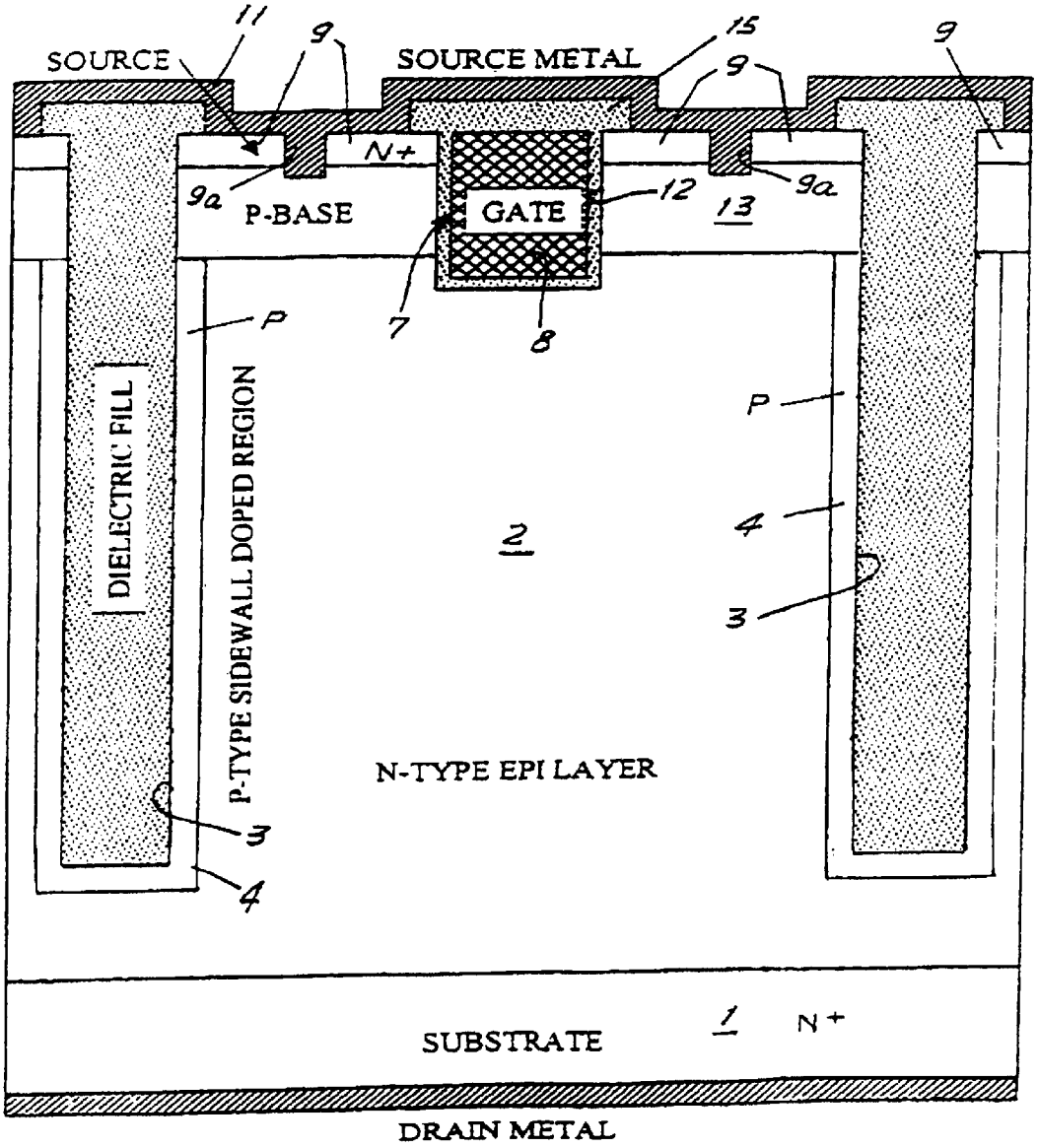
FIG. 1 is a cross-section of a small portion of a superjunction chip made in accordance with the invention.

Referring first to FIG. 1, there is shown a very small portion of the substrate 1 upon which the device is build. Note that dimensions are exaggerated in FIG. 1 for purpose of clarity of description. Substrate 1 is a low resistivity $N^+$ type substrate. An $N^-$ type epitaxial layer 2 is grown atop substrate 1 to a thickness of about 45 micrometers and doped to a concentration about $10^{16}$ impurity atoms per $cm^3$. A P base region 13 about 3 micrometers deep is formed in the top surface of region 2. A plurality of parallel grooves or trenches 3, which are each about 35 micrometers deep and about 5 micrometers wide, and spaced apart by about 5 micrometers are then etched into the upper surface of the silicon, through P base 13 and into the N epi body 2.

The side walls and bottoms of each of trenches 3 are doped P type, by any suitable process, and are shown as P layer 4 which lines each groove 3. P regions 4 electrically contact P base 13 while the mesa shaped region of epi 2 between the trenches 3 remains of the N type. The doses in $N^-$ epi layer 2 and P region 4 can be varied, or tailored, to obtain desired switching characteristics.

The trenches 3 are then filled with a dielectric material 6, which may be a single dielectric or a combination of two or more dielectric media as later described in FIG. 3.

Shallow trenches such as trench 12 are then etched through P base layer 13, and into region 2, between pairs of trenches 4. A gate oxide 7 is then grown over and lines the interior of trenches 12, and a conductor material 8, for example, conductive polysilicon, fills the trenches 12, forming the gate electrode of the final device. The conductivity of region 13 adjoining gate insulation 7 can now be conventionally modulated by the application of bias voltage to gate electrode 8.

High dose, low energy implants of a suitable N type species are then applied to the top surface of the device to form shallow, high concentration and low resistivity $N^+$ source regions 9.

Shallow trenches 9a are then etched through source regions 9 and into the P base on opposite sides of gate 8, and a source contact metal 11 is applied to the device surface, making contact to N+ sources 9 and P bases 13. Note that an insulation oxide 15 insulates gate 8 from source 11.

In making the device of FIG. 1, any desired topology such as laterally elongated parallel stripes or a cellular geometry such a rectangular or circular hole can be used for trenches 3.

The base 13, source regions 9, gate oxide 7 and gate 8 form together a MOSgate type structure for controlling the conduction and blocking of the semiconductor device.

The operation of the device of FIG. 1 is as follows, considering first its operation in the blocking mode: When the gate 8 is grounded with respect to the source 10 and a high relative bias applied to the drain 11, the alternate N and P regions 2 and 4 deplete out, allowing an almost uniform electric field distribution in the region between the trenches 3. The doping in, and thicknesses of the regions 2 and 4 must be carefully controlled as well known, to obtain optimal blocking performance.

Considering next operation in the conduction mode, with the application of a bias to the gate electrode 8 and the grounding of the source 9, an N-type channel is formed on the channel surface between base 13 and gate oxide 7. The device can now conduct current and the application of a small bias to the drain will cause a current to flow in the device with ultra low $R_{DSON}$.

The use of deep trenches 3 to form the P-type regions 4 allows the use of lower resistivity N-type drift conduction regions 2 than would be allowed by conventional devices. Further, the use of vertical trenches as opposed to successive horizontal epitaxial layers as in the prior art allows higher device density (by a factor of at least 30–40%) and further reduces the conduction losses in the device.

Figure 2:
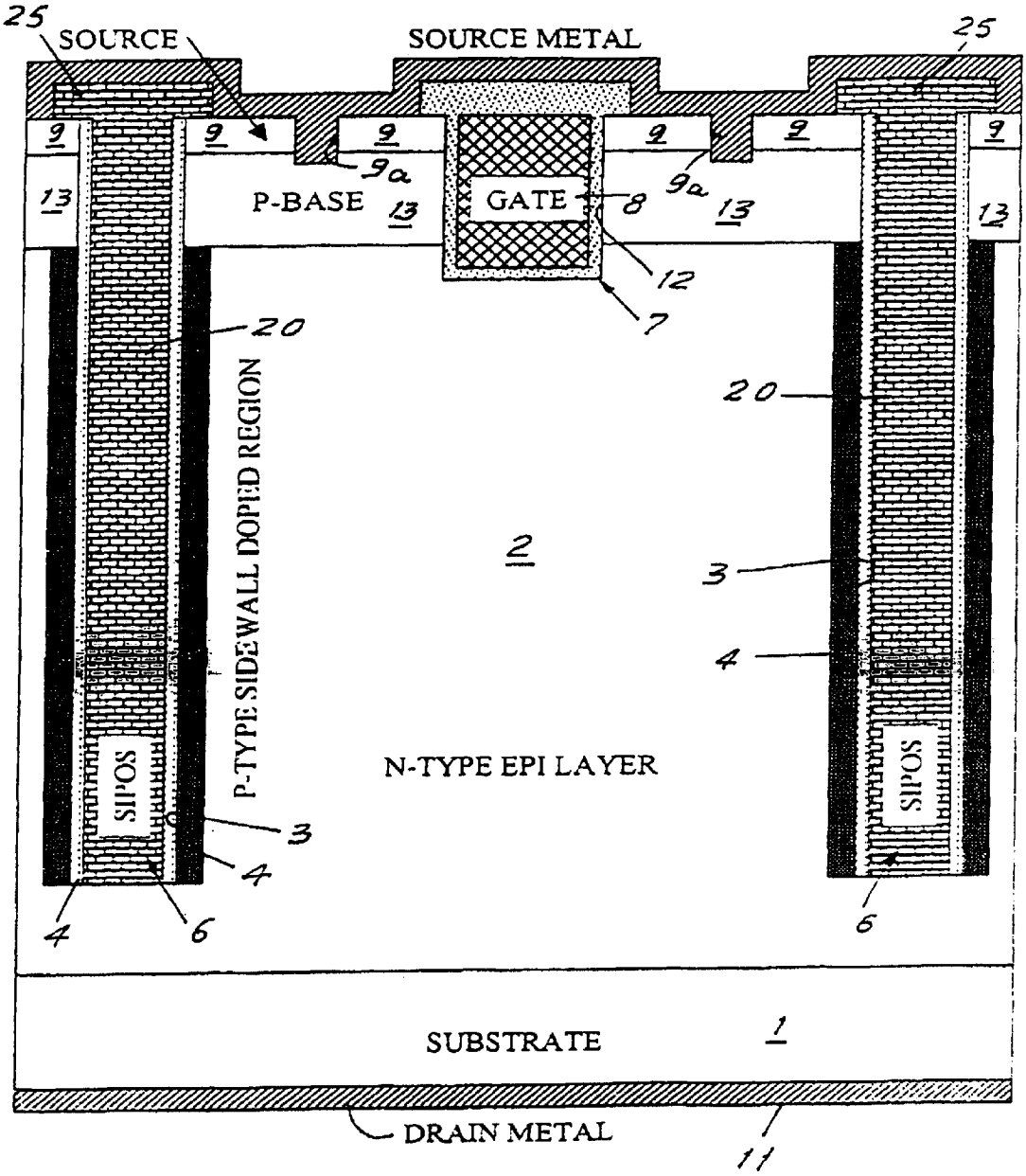
FIG. 2 is a cross-section of a small portion of a superjunction chip made in accordance with a second feature of the invention and using a SIPOS filler in the vertical trenches.

Referring next to the embodiment of FIG. 2, similar numerals to those of FIG. 1 identify similar elements. The embodiment of FIG. 2 differs from that of FIG. 1 in that the interior of trenches 3 is filled with a semi-insulating polysilicon (SIPOS) body 20 instead of the dielectric filler of FIG. 1. The tops 25 of the SIPOS body 20 are connected to sources 9 and its bottom is connected to the N type epi layer 2. Note that the bottoms of trenches 3 in FIG. 2 are not covered with insulation as in FIG. 1.

As a result, the SIPOS bodies provide a highly resistive leakage current path between source 9 and drain (2/1/11), forcing a uniform potential distribution along the length of the trenches 3, thus reinforcing the RESURF effect of the trench sidewall doping.

That is, during blocking, when the gate 8 is grounded with respect to the source 10 and a high relative bias applied to the drain 11, the regions 5 and 4 deplete out allowing an almost uniform electric field distribution in the region between the trenches 3. The topping in the regions 4 and 5 must be carefully controlled to obtain optimal blocking performance. The highly resistive leakage path between source 10 and drain 11 through the SIPOS film 20 reinforces this almost uniform electric field distribution due to the resistive potential distribution along the SIPOS. Further, use of the SIPOS reinforces the RESURF effect of the P-type sidewalls and reduces the effect of variations in the P-type sidewall does and epi resistivity. The SIPOS film 20 however does not affect operation in the forward conduction mode.

Figure 3:
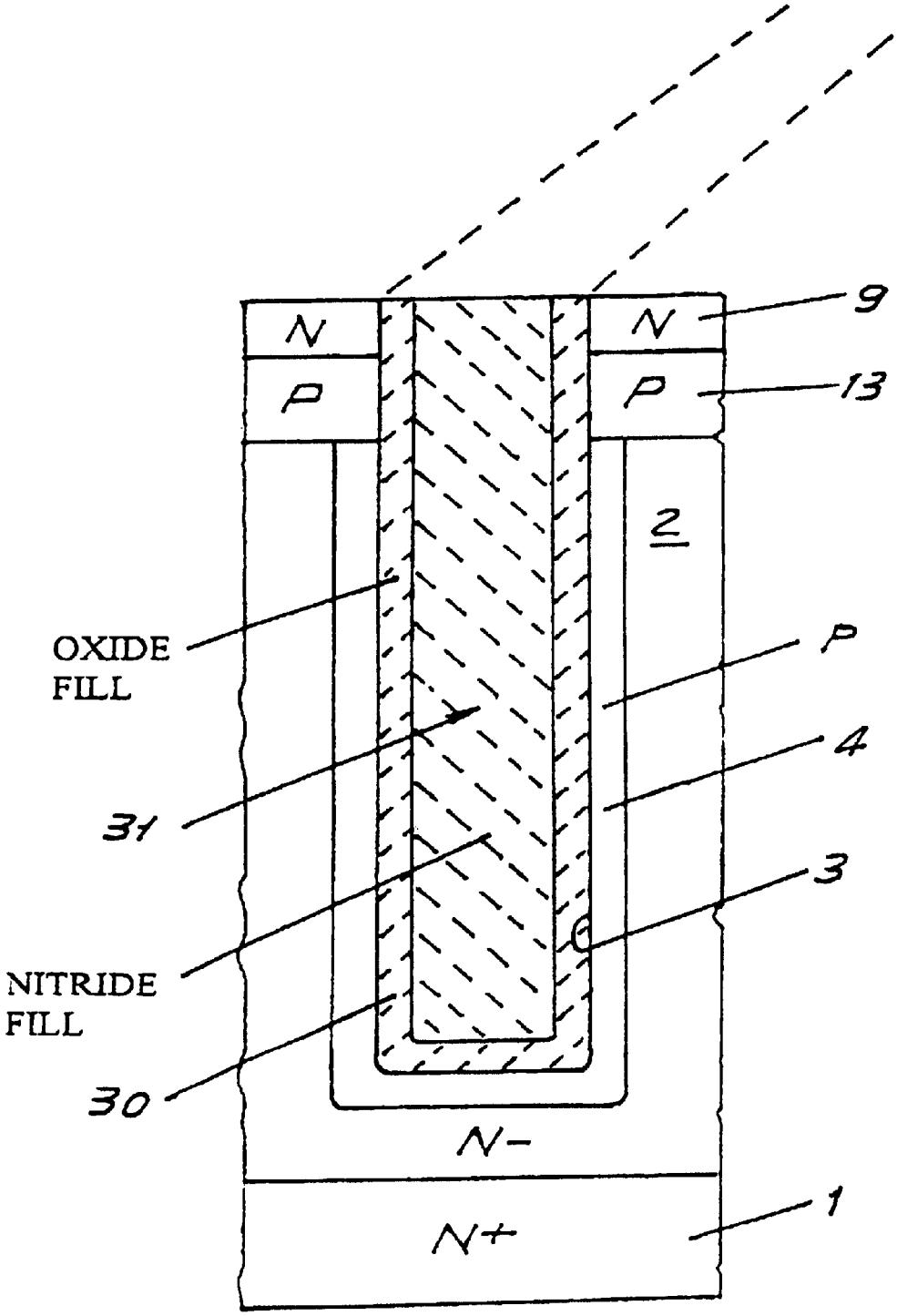
FIG. 3 is a cross-section of a trench of FIG. 1 in which the trench dielectric consists of layers of oxide and nitride which provide thermal expansion compensation to the surrounding silicon.

Referring next to FIG. 3, there is shown a novel filler for the trench of FIG. 1 which prevents the "fanning-out" effect which sometimes occurs when filling parallel spaced trenches with an oxide filler. Numerals identical to those of FIGS. 1 and 2 identify identical elements in FIG. 3.

The fan phenomenon is caused when hot oxide is grown or deposited into deep trenches in any silicon trench-type device. Thus, when cooling, the oxide does not shrink as much as the silicon so that, when cool, the oxide tends to spread apart the trench. This effect is magnified in a product having many parallel trenches, all filled at the same time, causing the silicon to warp and sometimes fracture.

In accordance with the invention, and in the step following the formation of P diffusion 4, the trench 3 is first partly filled, along its height, with an initial thin oxide liner 30. The remainder of the trench 3 is then filled with nitride ($Si_3O_4$) 31 which has a temperature coefficient of expansion which is greater than that of both silicon and oxide. Consequently, upon cooling, the total lateral dimension change of the oxide and nitride layers 30 and 31 is more closely matched to that of the silicon 2 to avoid or reduce stress on the silicon 2.

While oxide and nitride are described, other insulation materials may be selected, and may be applied in a reversed sequence. Further, a plurality of interleaved pairs of diverse insulation layers can be used.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A high voltage vertical conduction superjunction semiconductor device comprising:

a body of one conductivity type;

a plurality of spaced vertical trenches formed into the upper surface of said body;

*diffusions including* a diffusion of [the] *an* other conductivity type formed into the interior surface of *each of* said plurality of said trenches;

a MOSgated structure connected to the top of said body and to the top of each of said diffusions;

the thickness and concentration of said [diffusion] *diffusions* and the width and concentration of said body being matched to [insure] *ensure* substantially full depletion of said [diffusion] *diffusions* and body when blocking voltage is applied to said body;

wherein said MOSgated structure comprises a base of the other conductivity type extending across the top of said body, a plurality of spaced source regions of the one conductivity type diffused into said base, a plurality of second trenches in the top of said base and between respective pairs of said trenches, a gate oxide lining the interior of said second trenches and a conductive polysilicon gate filling the interior of said second trenches; and a source contact formed on the top surface of said device and in contact with said base and with said source regions.

2. The device of claim 1 wherein the interiors [of each] of each of said trenches is filled with a dielectric material.

3. The device of claim 2, wherein said dielectric is silicon dioxide.

4. The device of claim 1, wherein each of said trenches are laterally elongated parallel trenches.

5. The device of claim 4, wherein the interiors of each of said trenches is filled with a dielectric material.

6. The device of claim 1, wherein each of said trenches has a closed cellular topology.

7. The device of claim 2, wherein each of said trenches has a closed cellular topology.

8. A high voltage vertical conduction superjunction semiconductor device comprising:

a body of one conductivity type;

a plurality of spaced vertical trenches formed into the upper surface of said body;

*diffusions including* a diffusion of [the] *an* other conductivity type [formed] *extending* into *said body from* the interior surface of *each of* said plurality of trenches; and a MOSgated structure *that includes a base region of the other conductivity* connected to the top of said body and to the top of each said diffusions;

the thickness and concentration of said [diffusion] *diffusions* and the width and concentration of said body being matched to [insure] *ensure* substantially full depletion of said [diffusion] *diffusions* and body when blocking voltage is applied to said body; and wherein *said vertical trenches extend through said base region and* the interiors of each of said trenches is filled with a highly resistive material which is connected to a source electrode at its top and [said] *a* drain structure at its bottom and carries an intentional leakage current under blocking conditions to force a uniform electric field distribution along the length of *each of* said trench*es* during a blocking condition.

[9. The device of claim 1, wherein said dielectric is a highly resistive material which is connected to a source electrode at its top and said drain structure at its bottom and carries an intentional leakage current under blocking conditions to force a uniform electric field distribution along the length of said trench during a blocking condition.]

10. The device of claim 8, wherein each of said trenches are laterally elongated parallel trenches.

11. The device of claim 8, wherein each of said trenches has a closed cellular topology.

12. A high voltage vertical conduction superjunction semiconductor device comprising:

a body of one conductivity type;

a plurality of spaced vertical trenches formed into the upper surface of said body;

*diffusions including* a diffusion of the other conductivity type [formed] *extending* into *said body from* the interior surface of *each of* said plurality of said trenches; and a MOSgated structure *that includes a base region of the other conductivity type* connected to the top of said body and to the top of each of said diffusions;

the thickness and concentration of said [diffusion] *diffusions* and the width and concentration of said body being matched to [insure] *ensure* substantially full depletion of said [diffusion] *diffusions* and body when blocking voltage is applied to said body; and wherein *said trenches extend through said base region and* the interiors of each of said trenches is filled with a semi-insulating polysilicon.

13. The device of claim 2, wherein said dielectric is a semi-insulating polysilicon.

14. The device of claim 10, wherein said [dielectric] *highly resistive material* is a semi-insulating polysilicon.

15. The device of claim 11, wherein said [dielectric] *highly resistive material* is a semi-insulating polysilicon.

16. The device of claim 2, wherein said dielectric material consists of alternate vertical layers of at least a first and second dielectric of diverse thermal expansion characteristics which, together, match the expansion characteristics of silicon.

17. The device of claim 16, wherein said first and second dielectrics are silicon dioxide and silicon nitride respectively.

18. The device of claim 16, wherein said MOSgated structure comprises a base of the other conductivity type extending across the top of said body, a plurality of spaced source regions of the one conductivity type diffused into said base, a plurality of second trenches in the top of said base and between respective pairs of said trenches, a gate oxide lining the interior of said second trenches and a conductive polysilicon gate filling the interior of said second trenches; and a source contact formed on the top surface of said device and in contact with said base and with said source regions.

19. The device of claim 16, wherein each of said trenches are laterally elongated parallel trenches.

20. The device of claim 17, wherein each of said trenches are laterally elongated parallel trenches.

[21. The device of claim 20, wherein said first and second dielectrics are silicon dioxide and silicon nitride respectively.]

22. The device of claim 20, wherein said device contains a plurality of parallel trenches; each of said trenches being filled by said dielectric filler.

*23. A high voltage vertical conduction superjunction semiconductor device comprising:*

*a body of one conductivity type;*

*a plurality of spaced vertical trenches formed into the upper surface of said body;*

*diffusions including a diffusion of an other conductivity type extending into said body from the interior surface of each of said plurality of said trenches;*

*a MOSgated structure connected to the top of said body;*

*the thickness and concentration of said diffusions and the width and concentration of said body being matched to ensure substantially full depletion of said diffusions and body when blocking voltage is applied to said body;*

*wherein said MOSgated structure comprises a base of the other conductivity type extending across the top of said body, a plurality of spaced source regions of the one conductivity type diffused into said base, a plurality of second trenches in the top of said base and between respective pairs of said trenches, a gate oxide lining the interior of said second trenches and a conductive polysilicon gate filling the interior of said second trenches; and a source contact formed on the top surface of said device and in contact with said base and with said source regions.*

*24. A high voltage vertical conduction semiconductor device comprising:*

*a substrate of one conductivity type;*

*a body of said one conductivity type over said substrate;*

*a base region of an other conductivity type;*

*a plurality of spaced vertical trenches formed into the upper surface of said body and extending through said base region, each trench including opposing sidewalls and a bottom, said bottom residing in said body, whereby each trench terminates in said body, each trench being filled with an insulator;*

*diffusions including a diffusion of the other conductivity type electrically coupled to said base region and extending into said body from said sidewalls and said bottom of each trench and forming a PN junction with said body, the thickness and concentration of each said diffusions and the width and concentration of said body being selected to ensure substantially full depletion of said diffusions and*

*a source electrode electrically connected to said diffusions; and*

*a drain electrode electrically connected to said substrate.*

*25. The semiconductor device of claim 24, wherein said insulator is comprised of an oxide.*

*26. The semiconductor device of claim 24, wherein said insulator includes a nitride.*

*27. The semiconductor device of claim 24, wherein said insulator includes an oxide liner and a nitride filler.*

*28. The semiconductor device of claim 24, wherein said insulator is selected to reduce thermal stress on said body.*

*29. A high voltage vertical conduction superjunction semiconductor device comprising:*

*a substrate of one conductivity type;*

*a body of said one conductivity type over said substrate;*

*a base region of an other conductivity type;*

*a plurality of spaced vertical trenches formed into the upper surface of said body and extending through said base region;*

*diffusions including a diffusion of the other conductivity type electrically coupled to said base region and extending into said body from the interior surface of each said plurality of said trenches, the thickness and concentration of said diffusions and the width and concentration of said body being selected to ensure substantially full depletion of said diffusions and body when blocking voltage is applied to said body;*

*a MOSgated structure connected to the top of said body;*

*a source electrode electrically connected to said diffusions;*

*a drain electrode electrically connected to said substrate; and*

*a highly resistive current path between said drain electrode and said source electrode.*

* * * * *